(12) United States Patent
Nakano et al.

(10) Patent No.: US 7,738,844 B2
(45) Date of Patent: Jun. 15, 2010

(54) RADIO COMMUNICATION DEVICE

(75) Inventors: Hiroshi Nakano, Yamanashi (JP);
Yasutake Hirachi, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 537 days.

(21) Appl. No.: 11/094,532

(22) Filed: Mar. 31, 2005

(65) Prior Publication Data

US 2005/0221786 A1 Oct. 6, 2005

(30) Foreign Application Priority Data

Mar. 31, 2004 (JP) .............................. 2004-105685

(51) Int. Cl.
*H01Q 11/12* (2006.01)
*H04B 1/04* (2006.01)

(52) U.S. Cl. ..................... 455/118; 455/318; 375/295

(58) Field of Classification Search ............... 455/317, 455/318, 319, 91–119; 375/295–315
See application file for complete search history.

(56) References Cited

U.S. PATENT DOCUMENTS

| | | | | |
|---|---|---|---|---|
| 4,083,004 | A * | 4/1978 | Cohn ........................ 455/18 |
| 4,206,421 | A * | 6/1980 | Bernhard et al. ............... 331/19 |
| 5,101,505 | A * | 3/1992 | Schiller et al. ................ 455/86 |
| 5,150,078 | A * | 9/1992 | Yang et al. ..................... 331/2 |
| RE35,650 | E  * | 11/1997 | Partyka et al. ............... 375/141 |
| 5,809,409 | A * | 9/1998 | Itoh et al. ................... 455/327 |
| 5,867,794 | A * | 2/1999 | Hayes et al. ................. 455/557 |
| 6,057,740 | A * | 5/2000 | Consolazio et al. ........... 331/25 |
| 6,133,795 | A * | 10/2000 | Williams ........................ 331/9 |
| 6,317,590 | B1 * | 11/2001 | Nash et al. ................... 455/331 |
| 6,677,882 | B1 * | 1/2004 | Wedel, Jr. ..................... 342/13 |
| 6,714,800 | B2 * | 3/2004 | Johnson et al. ............. 455/561 |
| 6,826,234 | B1 * | 11/2004 | Shoji et al. .................. 375/259 |
| 7,088,980 | B2 * | 8/2006 | Otaka .......................... 455/323 |
| 7,164,902 | B2 * | 1/2007 | Yamada et al. .............. 455/326 |
| 7,221,311 | B2 * | 5/2007 | Kashiwa et al. ............. 342/193 |
| 7,251,461 | B2 * | 7/2007 | Shoji et al. .................. 455/101 |
| 2001/0055953 | A1 * | 12/2001 | Shoji et al. ..................... 455/71 |
| 2002/0093448 | A1 * | 7/2002 | Chang ......................... 341/176 |

(Continued)

FOREIGN PATENT DOCUMENTS

JP 2001-53640 2/2001

(Continued)

OTHER PUBLICATIONS

European Search Report, dated Mar. 31, 2006, issued in corresponding European Application No. 05 25 2039.

(Continued)

*Primary Examiner*—Nguyen Vo
*Assistant Examiner*—RuiMeng Hu
(74) *Attorney, Agent, or Firm*—Westerman, Hattori, Daniels & Adrian, LLP

(57) ABSTRACT

A radio communication device includes: a local oscillator; an amplifier amplifying an output signal of the local oscillator and outputting a local oscillation frequency and a harmonic wave component thereof; and a harmonic mixer receiving an output signal of the amplifier and an information signal, and generating an up-converted signal of the information signal with the harmonic wave component based on the local oscillation frequency, while allowing the harmonic wave component to pass through.

5 Claims, 7 Drawing Sheets

U.S. PATENT DOCUMENTS

| | | | |
|---|---|---|---|
| 2002/0102951 A1* | 8/2002 | Nakano et al. | 455/118 |
| 2002/0102959 A1* | 8/2002 | Buer et al. | 455/326 |
| 2002/0193068 A1* | 12/2002 | Sepehry-Fard | 455/3.02 |
| 2003/0109236 A1* | 6/2003 | Shoji et al. | 455/142 |
| 2003/0162515 A1* | 8/2003 | Zhou | 455/189.1 |
| 2004/0014446 A1* | 1/2004 | Chakraborty et al. | 455/226.4 |
| 2004/0077323 A1* | 4/2004 | Taki | 455/207 |
| 2005/0020231 A1* | 1/2005 | Yamada et al. | 455/326 |
| 2005/0075087 A1* | 4/2005 | Yamaji et al. | 455/232.1 |
| 2005/0143015 A1* | 6/2005 | Shoji et al. | 455/70 |
| 2005/0170789 A1* | 8/2005 | Consolazio | 455/78 |
| 2005/0176377 A1* | 8/2005 | Shoji et al. | 455/68 |
| 2005/0176398 A1* | 8/2005 | Maeda et al. | 455/326 |
| 2005/0191985 A1* | 9/2005 | Bos et al. | 455/326 |
| 2005/0227638 A1* | 10/2005 | Suematsu et al. | 455/118 |
| 2007/0010225 A1* | 1/2007 | Oosawa et al. | 455/255 |
| 2007/0149160 A1* | 6/2007 | Tseng et al. | 455/314 |

FOREIGN PATENT DOCUMENTS

| | | |
|---|---|---|
| JP | 2001-085951 A | 3/2001 |
| JP | 2003-163601 A | 6/2003 |
| WO | WO 03/038992 A | 5/2003 |

OTHER PUBLICATIONS

Office Action issued on Jul. 21, 2009 in corresponding Japanese Patent Application 2004-105685.

* cited by examiner

RADIO COMMUNICATION DEVICE

BACKGROUND OF THE INVENTION

1. Field of the Invention

This invention generally relates to radio communication devices, and more particularly, to a transmission technology suitable for a high frequency range as high as at least 30 GHz.

2. Description of the Related Art

Recently, there has been considerable activity in the research and development of communication technology using the submillimeter-wave frequency range or millimeter-wave frequency range as high as 30 GHz or more. In the above-mentioned high frequency range, it is difficult to generate the stabilized local oscillation frequency. The high-quality radio communication cannot be realized unless the stabilized local oscillation frequency is available on both the transmitter and receiver.

Japanese Patent Application Publication No. 2001-53640 (hereinafter referred to as Document 1) describes a technique for transmitting an unmodulated carrier having a local oscillation frequency together with a modulated radio signal. On the receiver, the received unmodulated carrier is used as the local oscillation frequency to demodulate the modulated radio signal. It is not necessary to provide a high-accuracy local oscillator on the receiver. It is thus possible to simplify the structure of the receiver. In the case where the unmodulated carrier and the modulated radio carrier are affected by the same environmental factor such as temperature change, the affect of the environmental factor (fluctuations due to the temperature change) can be cancelled by demodulating with the received unmodulated carrier, and an excellent communication quality can be thus provided.

The invention disclosed in Document 1, however, employs a local oscillator that generates the oscillation frequency identical to that of the unmodulated carrier to be output from an antenna. There is a problem in that the stable modulated radio carrier cannot be generated. In order to obtain the local oscillator capable of stably generating the oscillation frequency of at least 30 GHz, there are still drawbacks to be solved even with the use of current technology. In particular, an extremely advanced technology and a considerable cost are required for producing the local oscillator having a frequency range as high as 60 GHz in order to realize the millimeter-wave radio communication with a frequency range of 60 GHz, which is considered attractive these days.

SUMMARY OF THE INVENTION

It is a general object of the present invention to provide a simple, less-expensive radio communication device capable of realizing radio communications using a frequency range as high as at least 30 GHz.

According to an aspect of the present invention, there is provided a radio communication device comprising: a local oscillator; an amplifier amplifying an output signal of the local oscillator and outputting a local oscillation frequency and a harmonic wave component thereof; and a harmonic mixer receiving an output signal of the amplifier and an information signal, and generating an up-converted signal of the information signal with the harmonic wave component based on the local oscillation frequency, while allowing the harmonic wave component to pass through. The harmonic wave component is generated by the amplifier and is caused to pass through the harmonic mixer. It is thus possible to transmit the harmonic wave component of the oscillation signal of the local oscillator together with the up-converted signal. The local oscillator may be enough to oscillate a comparatively low frequency, so that the radio communications using the frequency range as high as 30 GHz or higher can be realized by a simple structure at a low cost.

According to another aspect of the present invention, there is provided a radio communication device comprising: a local oscillator; an amplifier amplifying an output signal of the local oscillator and outputting an amplified signal including a harmonic wave component of the output signal of the local oscillator; and a harmonic mixer mixing the output signal of the local oscillator with an information signal to output an up-converted signal of the information signal.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
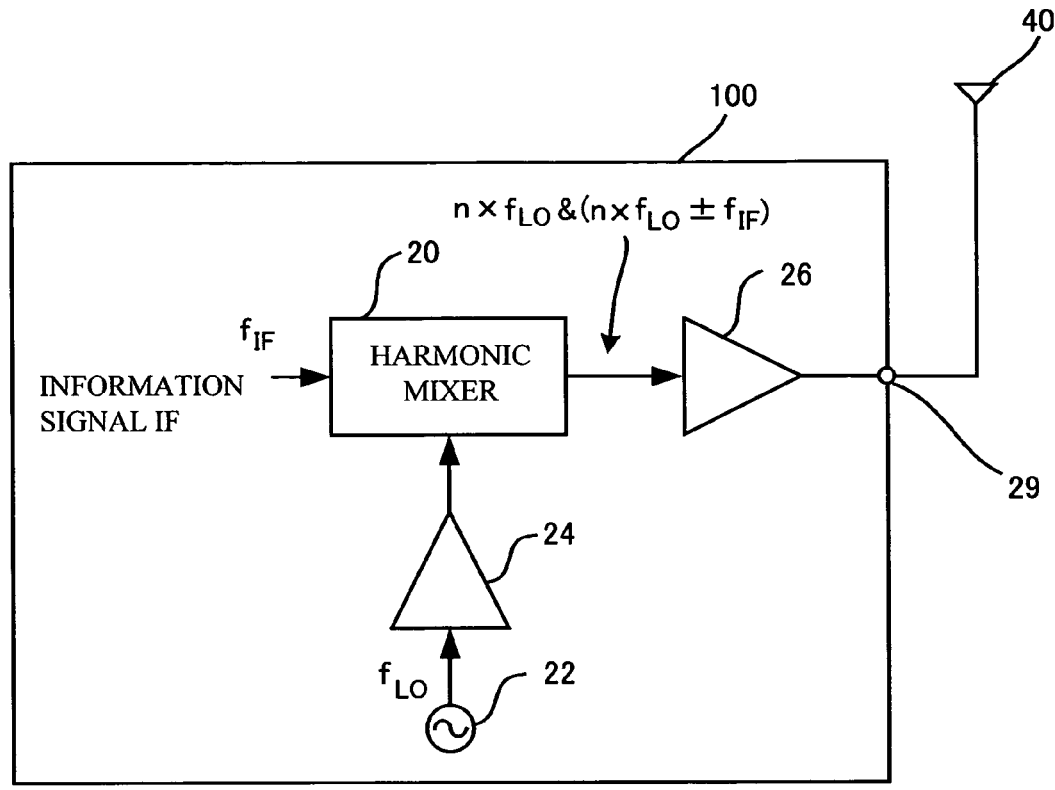
FIG. 1 is a block diagram of a ratio communication device in accordance with a first embodiment of the present invention.
Figure 2:
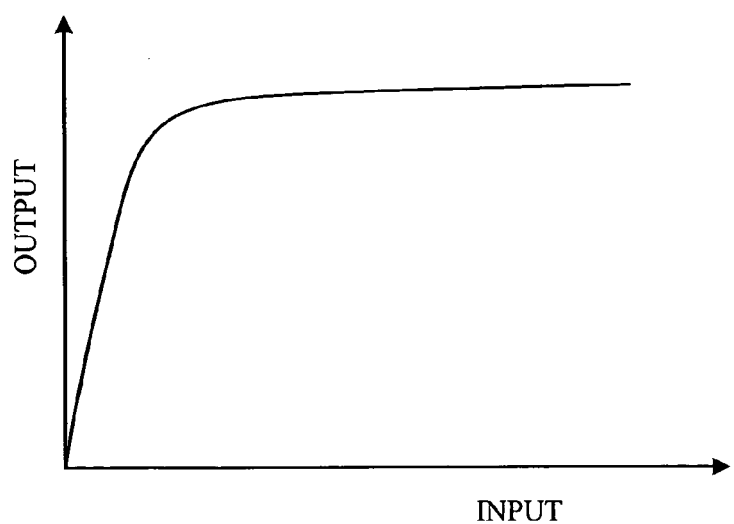
FIG. 2 is a graph of an input-output characteristic of an amplifier.
Figure 3A:
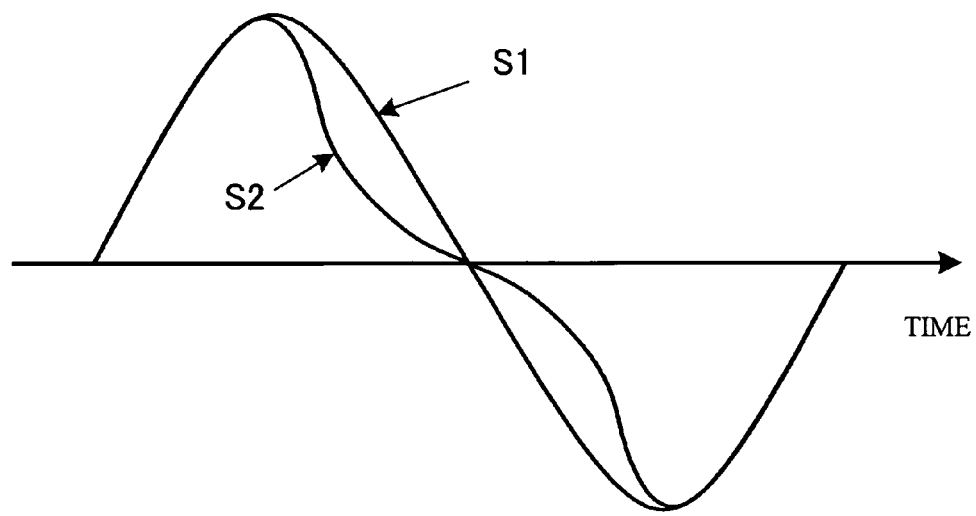
FIGS. 3A and 3B show output signal waveforms and frequency spectrums of the amplifier.
Figure 3B:
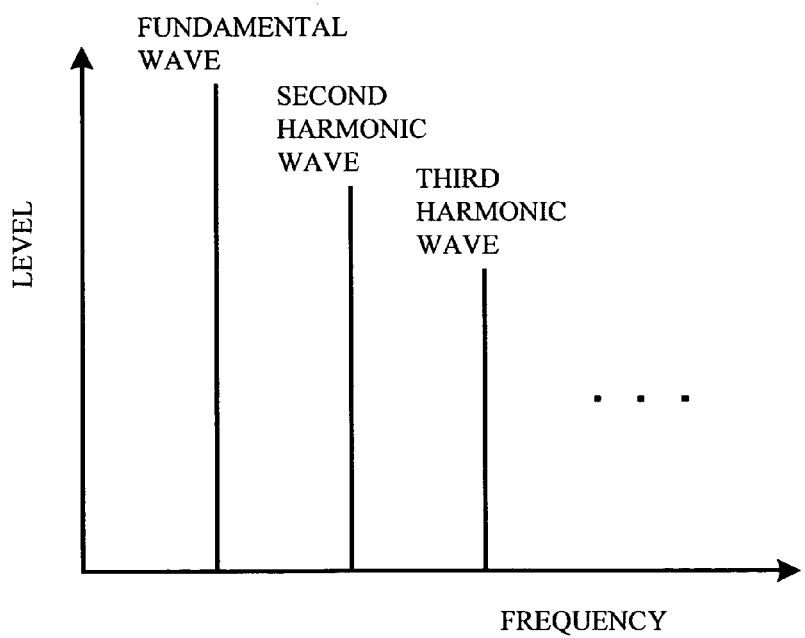

FIG. 1 is a block diagram of a ratio communication device 100 in accordance with a first embodiment of the present invention. The radio communication device 100 includes a harmonic mixer 20, a local oscillator 22, an amplifier 24, a power amplifier 26, and an external connection terminal 29. The local oscillator 22 generates a local oscillation signal of a frequency $f_{LO}$. The amplifier 24 is configured so as to have a linear gain region and a saturated gain region over which the frequency range of the oscillation output signal of the local oscillator 22 is located. FIG. 2 is a graph showing input-output characteristics of the amplifier 24. The amplifier 24 amplifies the oscillation output signal generated by the local oscillator 22 with the use of both the linear region and the saturated gain region shown in FIG. 2. As shown in FIG. 3A, the amplified oscillation output signal is not a linearly amplified signal S1 but a distorted signal S2. Referring to FIG. 3B, the distorted signal S2 includes harmonic wave components such as a second harmonic wave and a third harmonic wave, in addition to a fundamental harmonic wave of a frequency $f_{LO}$. Hereinafter, $n \cdot f_{LO}$ denotes the frequency components of the output signal of the amplifier 24 where n is a positive integer. The output signal of the amplifier 24 is applied to a first terminal of the harmonic mixer 20. An information signal IF of a frequency $f_{IF}$ is applied to a second terminal of the harmonic mixer 20.

The harmonic mixer 20 generates n-time waves $n \cdot f_{LO}$ of the frequency component $f_{LO}$ output from the amplifier 24, and mixes the harmonic wave components with the information signal IF to output up-converted frequencies, while allowing the harmonic wave components $n \cdot f_{LO}$ from amplifier 24 to pass through without change.

For simplification, a description will be directed to only the fundamental harmonic wave of the frequency $f_{LO}$ (the local oscillation signal) and the second harmonic wave (the frequency $2f_{LO}$) among the output waves of the amplifier 24, and will be given of a case where the harmonic mixer 20 generates only the second harmonic of the frequency $2f_{LO}$ of the fundamental harmonic wave $f_{LO}$. The harmonic mixer 20 generates the double wave $2f_{LO}$ of the fundamental harmonic wave $f_{LO}$ output from the amplifier 24, and mixes the double wave $2f_{LO}$ with the information signal IF to output up-converted frequencies $2f_{LO} \pm f_{IF}$, while allowing the second harmonic wave $2f_{LO}$ from the amplifier 24 to pass through without change. That is, the harmonic mixer 20 results in combined signals of the frequency $2f_{LO}$ and the frequencies $2f_{LO} \pm f_{IF}$. In other words, the output from the harmonic mixer 20 includes the signal component of the frequency $2f_{LO}$ and the signal components of the frequencies $2f_{LO} \pm f_{IF}$. In a commonly used expression having n replacing 2, the output of the harmonic mixer 20 includes the frequency component of $n \cdot f_{LO}$ and the frequency components of $n \cdot f_{LO} \pm f_{IF}$.

Figure 4:
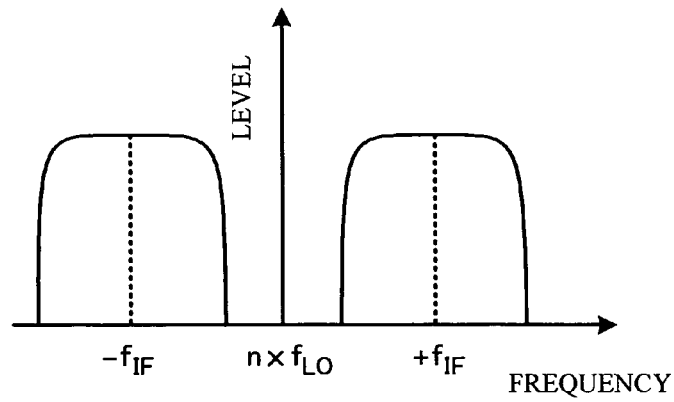
FIG. 4 shows a frequency spectrum of the output signal of a harmonic mixer.

FIG. 4 shows a frequency spectrum of the output signal of the harmonic mixer 20. The signal in the center of FIG. 4 has the frequency $n \cdot f_{LO}$, which has passed through the harmonic mixer 20 from the amplifier 24. The side band on the right has the center frequency $n \cdot f_{LO} + f_{IF}$, and the side band on the left has the center frequency $n \cdot f_{LO} - f_{IF}$. In the case where $f_{LO}$ is 30 GHz, $f_{IF}$ is 5 GHz, and n is 2, the harmonic mixer 20 has the signal of 60 GHz and modulated radio signals of 65 GHz and 55 GHz. The signal of 60 GHz is the local oscillation signal for antenna transmission, and is transmitted into the air together with the two modulated signals through the amplifier 26, the external connection terminal 29, and the antenna 40.

The harmonic wave components generated on the amplifier 24 are applied to the harmonic mixer 20. On the harmonic mixer 20, it is considered that the harmonic wave components generate higher frequencies due to the function of the harmonic mixer 20, and then the higher frequencies are mixed with the information signal IF. However, in fact, the intensity or power of the harmonic wave components applied to the harmonic mixer 20 is weakened, as the harmonic wave components have higher orders. These harmonic wave components cannot drive the harmonic mixer 20 sufficiently. Therefore, the harmonic wave components of high orders do not substantially affect the harmonic mixer 20.

The harmonic wave component of interest generated on the amplifier 24 passes through the harmonic mixer 20. However, the frequency of the double wave is close to the mixing frequency (target frequency) output from the harmonic mixer 20. Therefore, the frequency of the double wave is finally output to the outside. On the other hand, the triple wave and higher-order waves have originally weak intensities, and are located outside of the allowable frequency range of a circuit arranged at a rear stage. Therefore, these waves do not substantially affect the operation of the harmonic mixer 20.

The radio communication device 100 according to the first embodiment of the present invention employs the single local oscillator 22 is included, nevertheless the device 100 is capable of generating and outputting the local oscillation signal transmitted through the antenna having the frequency of $n \cdot f_{LO}$ equal to n times the local oscillation frequency $f_{LO}$. In other words, the local oscillator 22 may have the oscillation frequency of 1/n of a desired local oscillation signal transmitted through the antenna. In the above-mentioned case, the local oscillator 22 of 30 GHz may be prepared. It is thus possible to realize the simple, less-expensive radio communication device 100 suitable for a high frequency range of 30 GHz or higher. It should be noted that both the local oscillation signal transmitted through the antenna and the modulated radio signals pass through the harmonic mixer 20, and are affected by fluctuations of the harmonic mixer 20 in the same manner. Thus, the fluctuations on the harmonic mixer 20 can be cancelled by a demodulation process on the receiver with the use of the local oscillation signal transmitted through the antenna.

As described above, the power amplifier 26 is not involved in the operation of generating the frequency $n \cdot f_{LO}$ equal to n times of the oscillation frequency $f_{LO}$, and may be omitted as necessary.

Figure 5:
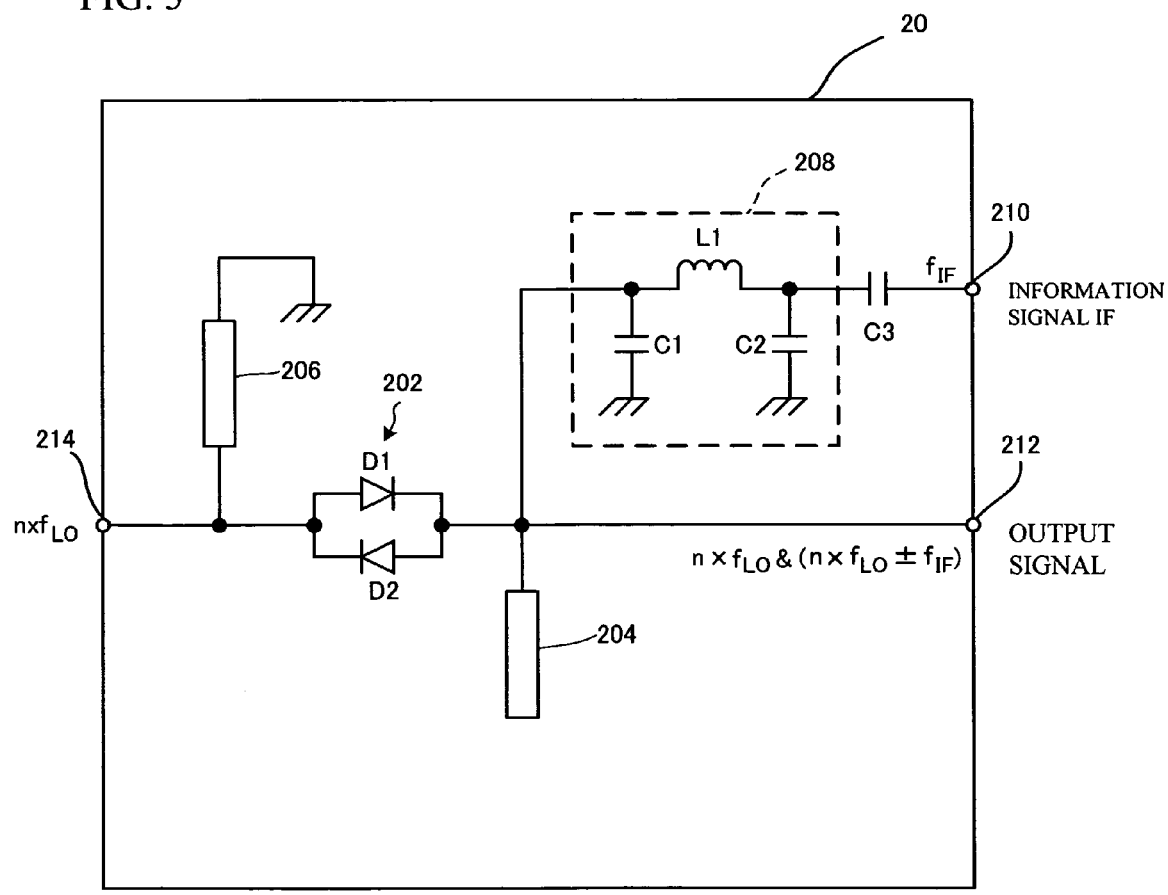
FIG. 5 is a circuit diagram of the harmonic mixer.
Figure 6:
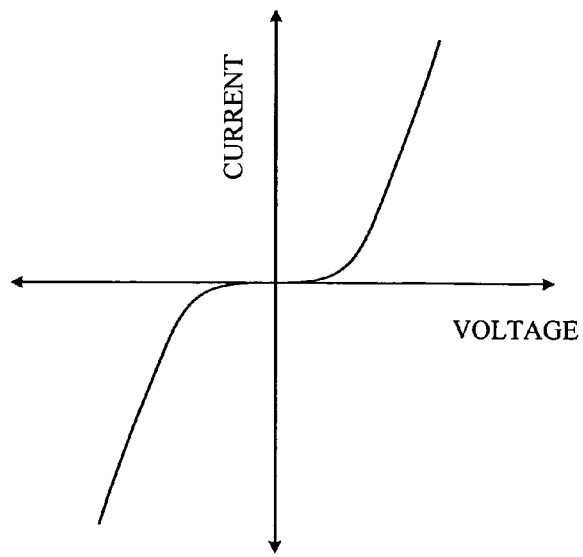
FIG. 6 is a graph of a current-voltage characteristic of an APDP.

FIG. 5 is a circuit diagram of the harmonic mixer 20 in which circuit components are connected by ideal lines for the sake of simplicity. The harmonic mixer 20 includes an anti-parallel diode (hereinafter, referred to as APDP) 202. The APDP 202 includes two diodes D1 and D2 connected in parallel in the reverse directions between two ends. FIG. 6 is a graph showing a current-voltage characteristic of the APDP 202. An input signal is fed to one end of the APDP 202, which generates the harmonic waves of the input signal by utilizing the nonlinear regions in the current-voltage characteristic. The output signal of the amplifier 24 is fed to one end of the APDP 202 through the external connection terminal 214. Hereinafter, in order to simplify the description, only the fundamental harmonic wave $n \cdot f_{LO}$ (n=1) of 30 GHz and the second harmonic wave $n \cdot f_{LO}$ (n=2) of 60 GHz will be considered. The information signal IF is applied to the other end of the APDP 202 through an external connection terminal 210, a decoupling capacitor C3, and a lowpass filter 208. As one example, the information signal IF has a frequencies of ±5 GHz. The lowpass filter 208 includes two capacitors C1 and C2 and an inductor L1. An open stub 204 and a short stub 206 are provided, as necessary, for suppressing the signal loss and improving the efficiency.

Now, a description will be given of an operation in the absence of the open stub 204 and the short stub 206. The APDP 202 utilizes the nonlinear regions of the input-output characteristics shown in FIG. 6, and generates the second harmonic wave of 60 GHz of the local oscillation frequency of 30 GHz, which is applied to one end of the APDP 202. The second harmonic wave of 60 GHz is mixed with the information signal IF of ±5 GHz at the other end of the APDP 202. The modulated radio signals of 55 GHz and 65 GHz are output to the outside through the external connection terminal 29 the external connection terminal 29 shown in FIG. 1. The signal of 60 GHz, which is the second harmonic wave output from the amplifier 24, simply passes through the APDP 202 and is applied to the external connection terminal 29. As a result, the signal of 60 GHz and the signals of 65 GHz and 55 GHz are available at the external connection terminal 29. The signal of 60 GHz is transmitted into the air as the local oscillation signal transmitted, together with the modulated radio signals of 55 GHz and 65 GHz via the antenna 40 shown in FIG. 1.

Figure 7:
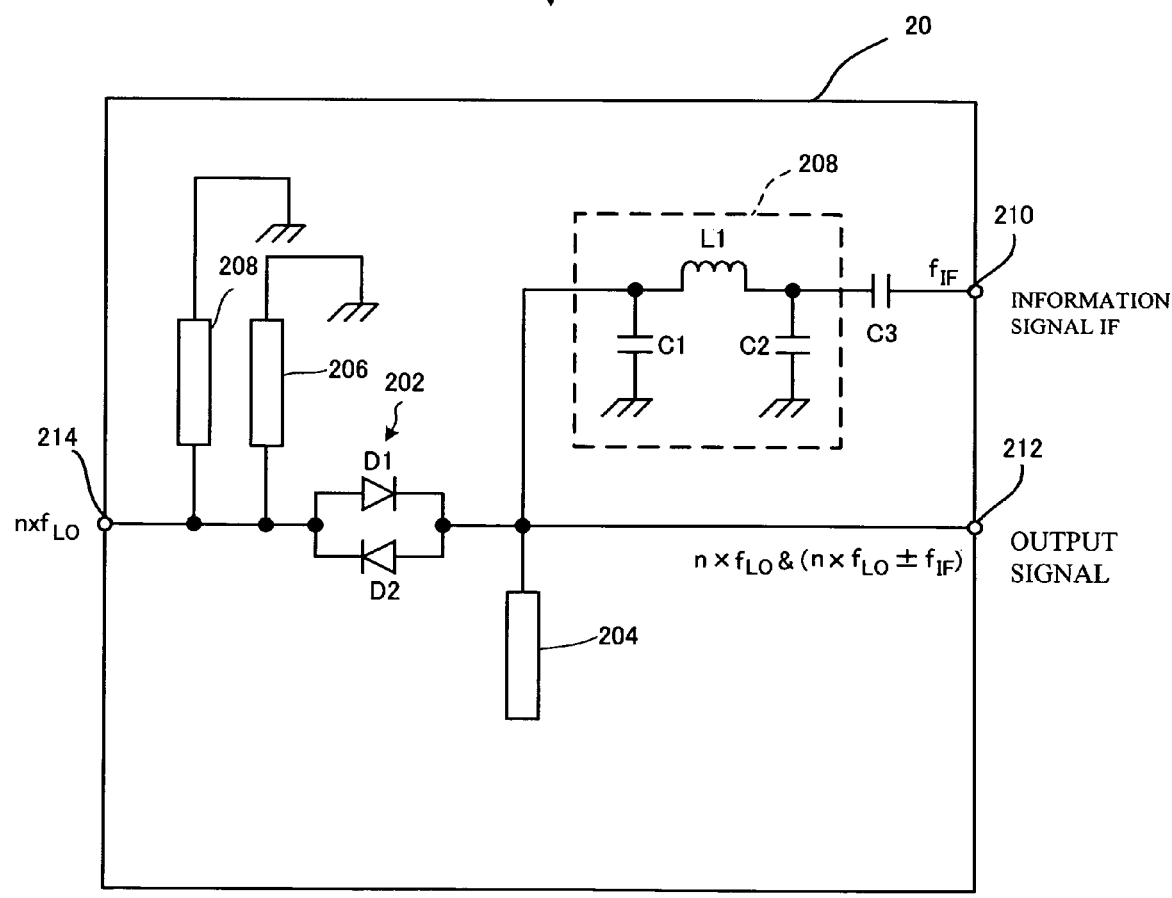
FIG. 7 is a circuit diagram of another configuration of the harmonic mixer shown in FIG. 1.

Preferably, as shown in FIG. 5, the open stub 204 and the short stub 206 are provided for suppressing the signal loss and improving the efficiency. The open stub 204 is connected to the output side of the APDP 202, and has a length equal to ¼ of the wavelength corresponding to the local oscillation frequency $f_{LO}$ generated by the local oscillator 22. Thus, the open end of the open stub 204 serves as ground, with respect to the signal of the local oscillation frequency $f_{LO}$ (30 GHz in the above-mentioned example). It is thus possible to apply the signal of 30 GHz effectively across the APDP 202. The open stub 204 does not function with respect to the signal of 60 GHz at all. The short stub 206 is connected to the input side of the APDP 202, and has a length equal to ¼ of the wavelength corresponding to either one of the modulated radio signals $2 \cdot f_{LO} \pm f_{IF}$ (one of 55 GHz and 65 GHz in the above-mentioned example). For example, in the case where the short stub 206 has a length equal to ¼ of the wavelength corresponding to the modulated radio signal of 65 GHz, the modulated radio signal of 65 GHz is effectively applied between the input side of the APDP 202 and the ground. Thus, the modulated radio signal of 65 GHz can be returned to the APDP 202. Alternatively, the short stub 206 may have a length equal to ¼ of the wavelength corresponding to the modulated radio signal of 55 GHz. The modulated radio signal may transmit both sidebands or either sideband. In the case where only one of the sidebands is transmitted, one short stub 206 may be provided. In the case where both sidebands are transmitted, preferably, another short stub 208 is provided as shown in FIG. 7, so that the two short stubs 206 and 208 are respectively provided to the modulated radio signals of 55 GHz and 65 GHz.

As described, the harmonic mixer 20 is capable of allowing the local oscillation frequency transmitted through the antenna to pass through and generating the modulated radio signal effectively.

Figure 8A:
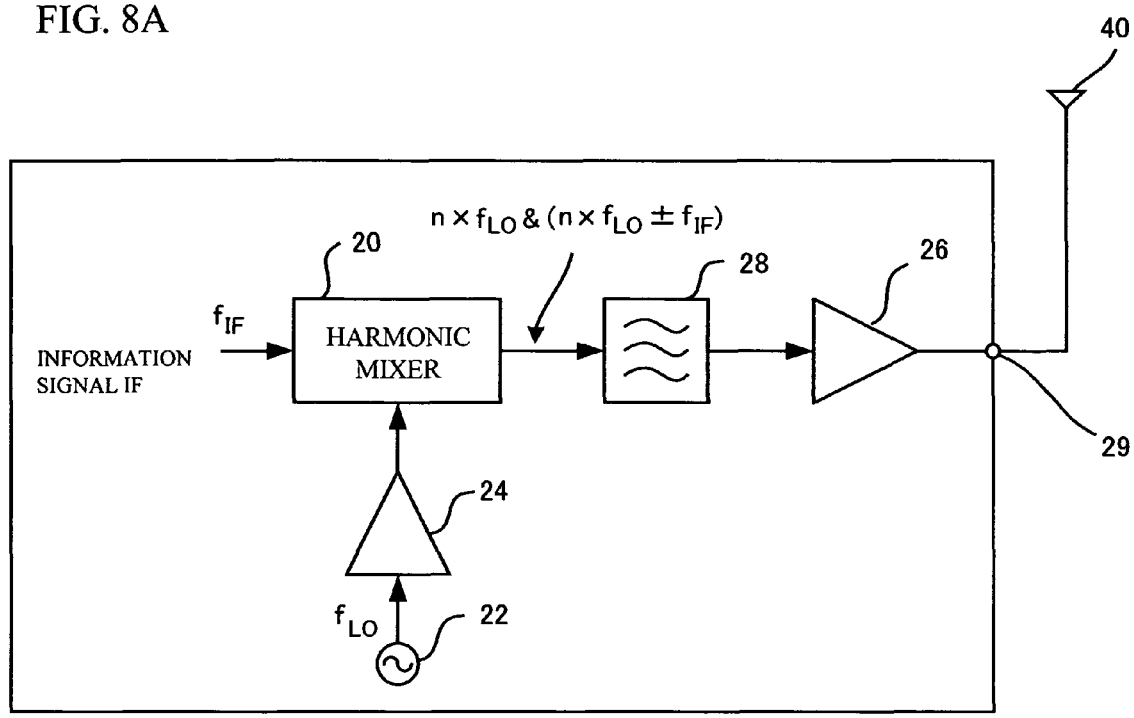
FIG. 8 is a variation of the circuit shown in FIG. 1.
Figure 8B:
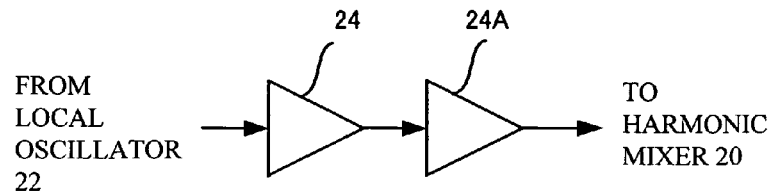

Referring to FIG. 8A, the harmonic mixer 20 may be followed by a bandpass filter 28, which can eliminate unnecessary frequency components. Referring to FIG. 8B, if the harmonic wave component outputs from the amplifier 24, in particular, the second harmonic wave component do not have the sufficient level, an amplifier 24A may follow the amplifier 24. The amplifier 24A linearly amplifies the second harmonic wave. In addition, the gain of the amplifier 24A may be changeable. Further, a bandpass filter may follow the amplifier 24 to supply the harmonic mixer 20 with only the local oscillation frequency $f_{LO}$ and the second harmonic wave $2 \cdot f_{LO}$.

Second Embodiment

Figure 9:
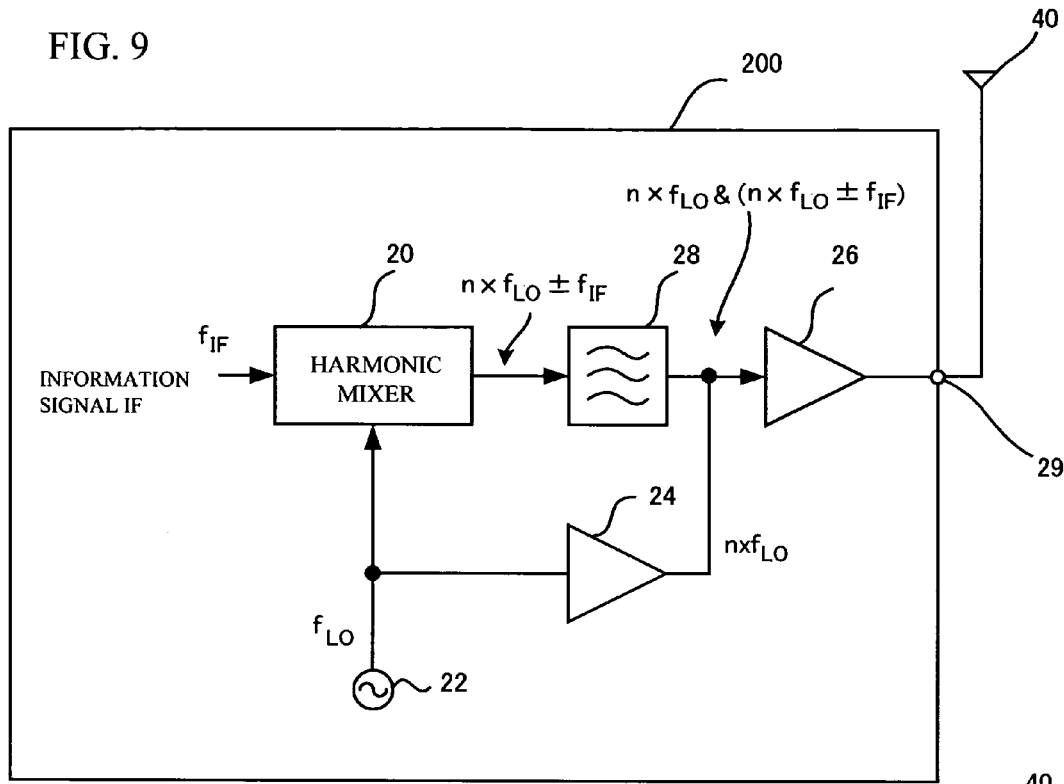
FIG. 9 is a block diagram of a radio communication device in accordance with a second embodiment of the present invention.

FIG. 9 is a block diagram of a radio communication device 200 according to a second embodiment of the present invention. Hereinafter, in the second embodiment, the same components and configurations as those of the first embodiment have the same reference numerals and a detailed explanation will be omitted, if not otherwise specified. The radio communication device 200 includes the harmonic mixer 20, the local oscillator 22, the amplifier 24, the bandpass filter 28, the power amplifier 26, and the external connection terminal 29. The output signal of the local oscillator 22 is applied to the harmonic mixer 20 and the amplifier 24. The harmonic mixer 20 generates n-time waves equal to n times of the frequency component $n \cdot f_{LO}$ included in the output signal of the amplifier 24, and combines the n-time waves with the information signal IF. The output frequencies of the harmonic mixer 20 in FIG. 9 are $n \cdot f_{LO} \pm f_{IF}$, which are different from those of the harmonic mixer 20 in FIG. 1. The output signal of the harmonic mixer 20 passes through the bandpass filter 28, and is fed to the power amplifier 26. The amplifier 24 has a configuration in which the frequency range of the oscillation output signal of the local oscillator 22 are located in both the linear gain region and the saturated gain region. The output signal includes the frequency components of $n \cdot f_{LO}$, where n=1, 2, . . . . That is to say, the output signal of the amplifier 24 includes the local oscillation frequency $f_{LO}$ and the harmonic wave components $n \cdot f_{LO}$ thereof. The output signal of the amplifier 24 is combined with the output signal of the harmonic mixer 20 that passes through the bandpass filter 28. Therefore, the power amplifier 26 electrically amplifies the signals of the local oscillation frequency $n \cdot f_{LO}$ and the frequencies $f_{LO} \pm f_{IF}$, and transmits the output signals through the antenna 40, which is connected to the external connection terminal 29.

As described, the radio communication device 200 includes the local oscillator 22, the amplifier 24, and the harmonic mixer 20, and brings about the same effect as that of the first embodiment of the present invention. The amplifier 24 amplifies the output signal of the local oscillator 22 and outputs the signal having the harmonic wave components. The harmonic mixer 20 combines the output signal of the local oscillator 24 with the information signal IF to output the up-converted signals of the information signal.

Figure 10:
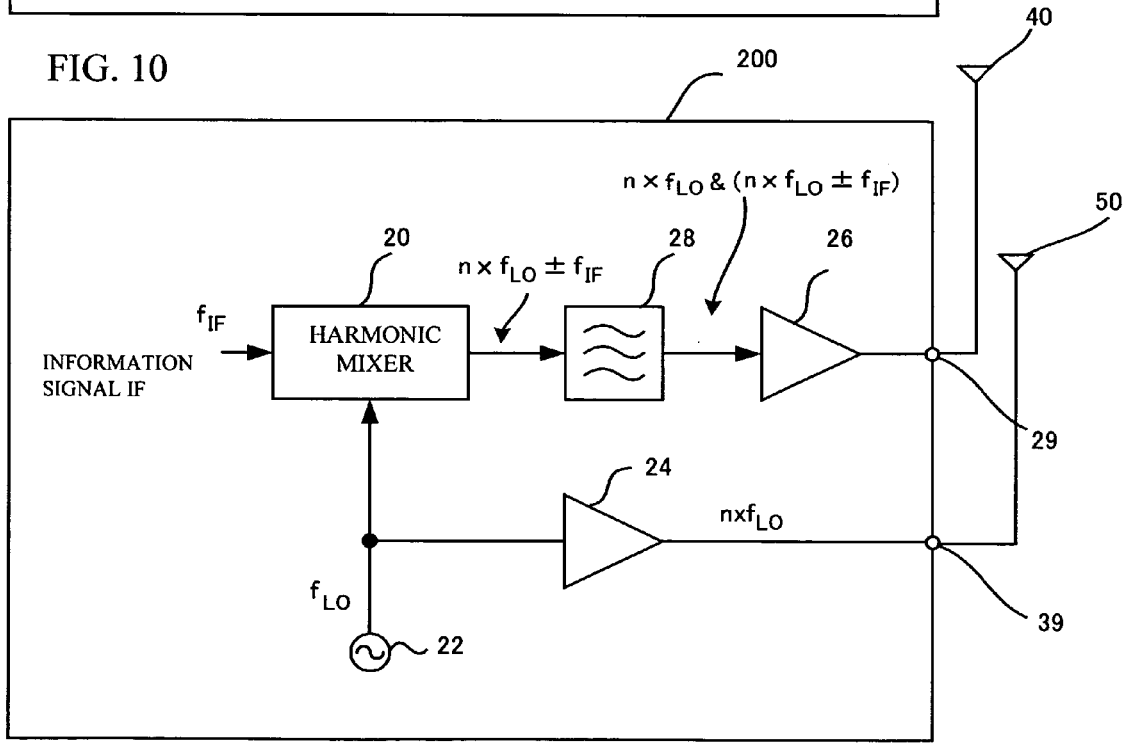
FIG. 10 is a block diagram of a variation example of the block diagram shown in FIG. 9.

Referring to FIG. 10, the output signal of the amplifier 24 may be transmitted from another antenna 50 rather than the antenna 40. This configuration is different from that in FIG. 9. In other words, the oscillation signal for antenna transmission may be transmitted from another antenna, which is different from the antenna for the modulated radio signal(s). The antenna 50 is connected to the external connection terminal 39.

Figure 11:
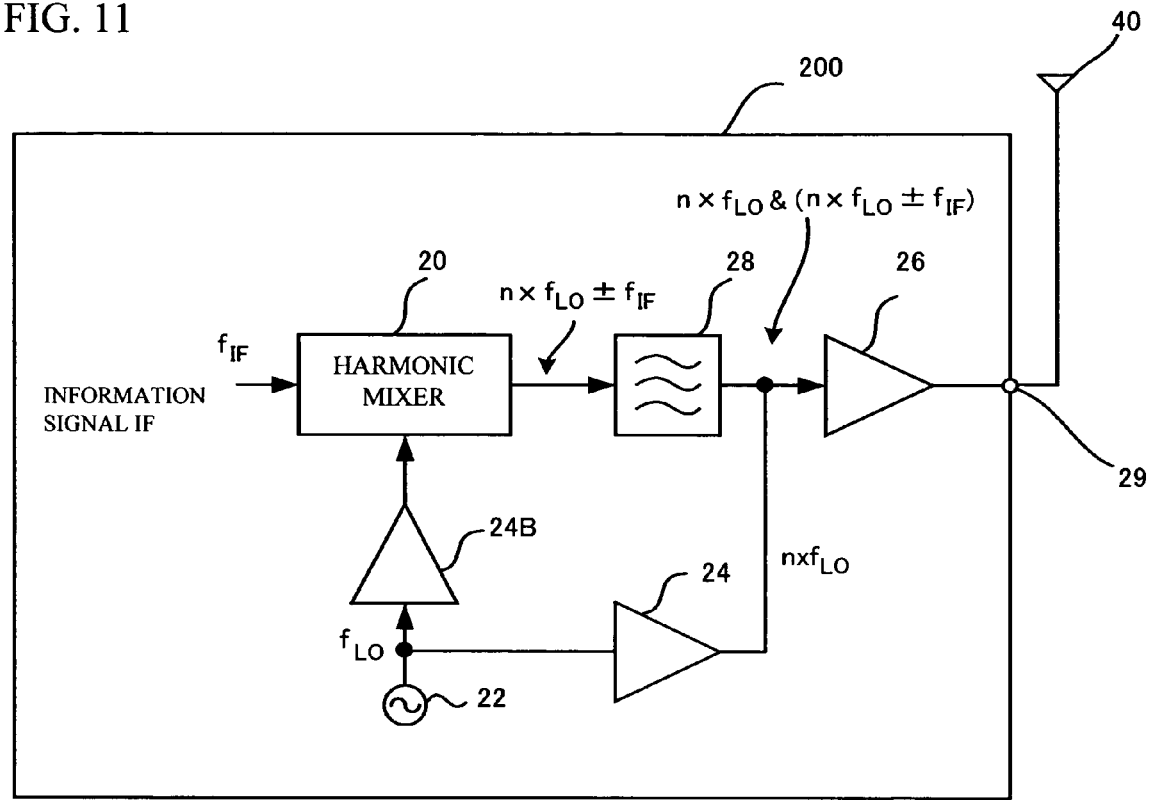
FIG. 11 is a block diagram of another variation example of the block diagram shown in FIG. 9.
Figure 12:
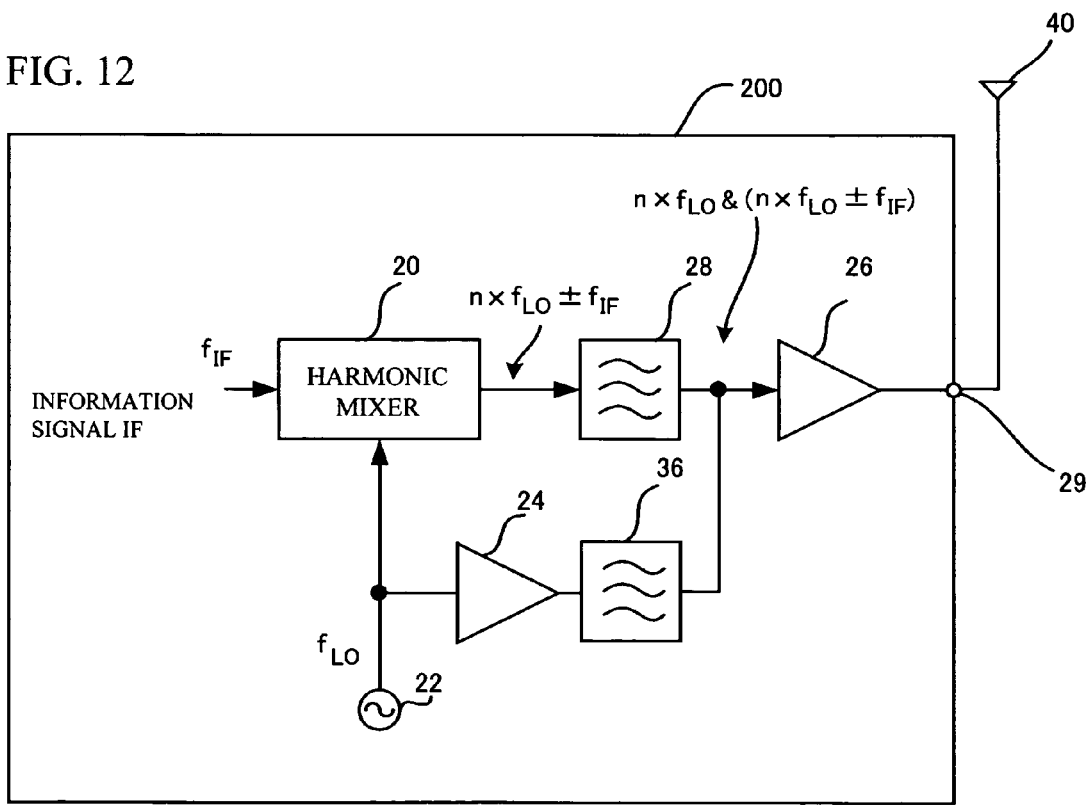
FIG. 12 is a block diagram showing yet another variation example of the block diagram shown in FIG. 9.

Referring to FIG. 11, an amplifier 24B is included for linearly amplifying the output of the local oscillator 22. The amplifier 24B may amplify the output to a desired level and output the amplified signal to the harmonic mixer 20. In this case, a bandpass filter may be arranged so as to follow the amplifier 24B to apply only the local oscillation frequency $f_{LO}$ to the harmonic mixer 20. Additionally, referring to FIG. 12, the amplifier 24 may be followed by a bandpass filter 36 to eliminate an undesired wave. For example, the bandpass filter 36 lets only $2f_{LO}$ pass through.

The present invention is not limited to the above-mentioned embodiments, and other embodiments, variations and modifications may be made without departing from the scope of the present invention.

The present invention is based on Japanese Patent Application No. 2004-105685 filed on Mar. 31, 2004, the entire disclosure of which is hereby incorporated by reference.

What is claimed is:

1. A radio communication device comprising:
   a local oscillator;
   an amplifier including first and second stages, the first stage amplifying an output signal of the local oscillator and having a linear gain region and a saturated gain region over which a frequency region of the output signal of the local oscillator is located so as to generate a harmonic wave component of the output signal of the local oscillator and to output the output signal of the local oscillator and the harmonic wave component thereof, the second stage being a linear gain amplifier; and
   a harmonic mixer receiving the output signal of the local oscillator from the amplifier and the harmonic wave component and an information signal, and generating a harmonic wave of the output signal of the local oscillator and mixing the harmonic wave with the information signal to output an up-converted signal, and allowing the harmonic wave component to pass through without change, the harmonic mixer having an anti-parallel diode including at least a short stub which has a length equal to ¼ of the wavelength corresponding to a center frequency of at least one of two side bands included in the up-converted signal, said up-converted signal being a modulated signal, the radio communication device outputting for transmission the up-converted signal and the harmonic wave component, wherein:

the harmonic wave component is unmodulated; and each of the harmonic wave component and the harmonic wave is a second harmonic wave component of the output signal of the local oscillator.

2. The radio communication device as claimed in claim 1, wherein the anti-parallel diode has a first end receiving an output signal of the amplifier, and a second end receiving the information signal, the second end also serving an output terminal of the harmonic mixer via which the up-converted signal and the harmonic wave component are output.

3. The radio communication device as claimed in claim 2, wherein the harmonic mixer comprises an open stub that is connected to the second end and has a length equal to ¼ of a wavelength corresponding to the output signal of the local oscillator.

4. The radio communication device as claimed in claim 3, wherein:

the short stub is connected to the first end.

5. The radio communication device as claimed in claim 1, further comprising a power amplifier following the harmonic mixer.

* * * * *